(12) United States Patent
Chen

(10) Patent No.: US 6,791,860 B2
(45) Date of Patent: Sep. 14, 2004

(54) READ-ONLY MEMORY WITH REDUCED LOADING VALUE

(75) Inventor: Shi-Xian Chen, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 10/436,389

(22) Filed: May 12, 2003

(65) Prior Publication Data
US 2003/0214828 A1 Nov. 20, 2003

(30) Foreign Application Priority Data
May 20, 2002 (TW) .......................... 91110579 A

(51) Int. Cl.⁷ ............................................. G11C 17/00
(52) U.S. Cl. ........................... 365/104; 365/51; 365/63
(58) Field of Search ............................ 365/104, 51, 63, 365/230.03

(56) References Cited

U.S. PATENT DOCUMENTS 5,852,570 A * 12/1998 Hotta et al. .................. 365/104
5,930,195 A *  7/1999 Komatsu ................ 365/230.03
6,002,606 A * 12/1999 Komatsu ..................... 365/63

* cited by examiner

Primary Examiner—Anh Phung
(74) Attorney, Agent, or Firm—Thomas, Kayden, Horstemeyer & Risley

(57) ABSTRACT

By adding multiple rows of auxiliary switches and then multiple current paths a read only memory circuit can be formed to reduce loading values when reading a specific memory cell. Therefore, the current can be increased, and the error probability of the sense amplifier can be reduced when reading a specific memory cell.

10 Claims, 4 Drawing Sheets

READ-ONLY MEMORY WITH REDUCED LOADING VALUE

This application claims the benefit of Taiwan application Serial No. 91110579, filed on May 20, 2002.

BACKGROUND OF THE INVENTION

1. Field of the Invention

The invention relates in general to a read-only memory, particularly to a read-only memory with a reduced loading value of bit lines.

2. Description of the Related Art

As the information industry matures, the demands for read-only memory increases. One of the main areas of research in the information industry is on how to improve accuracy while retrieving data contained in read-only memory.

FIG. 1 illustrates the equivalent circuit diagram of a traditional read-only memory. The read-only memory 100 usually includes multiple memory banks, such as the $n^{th}$ memory bank, Bank (n), and the $(n+1)^{th}$ memory bank, Bank (n+1). Each memory bank is composed of multiple memory cells B to form a memory array. Each memory cell B is for storing 1-bit binary data. Each memory cell B is implemented by a transistor. During the manufacturing process, each memory cell B is made to have different threshold voltage Vt according to the data to be stored. If the memory cell B is for storing data of 0, it has a high threshold voltage; if the memory cell B is for storing data of 1, it has a low threshold voltage. Selecting switches are controlled by selecting lines SL1~SL4. For example, the selecting switch M24(n) enables a main bit line BL(n) to be electrically connected to some of the sub-bit lines, such as sub-bit line SB4(n). The selecting switches are also implemented by transistors. In FIG. 1, a transistor marked with the symbol X represents a transistor with high threshold voltage; a transistor without an X is a transistor with low threshold voltage.

When reading memory cell B, which is in the $n^{th}$ memory bank Bank(n) and is controlled by a word line WL0, the operation of the circuit is described as follows: First, the main bit line BL(n) is connected to a sense amplifier SA and the main bit line GL(n+1) is connected to the ground end GND. At the same time, the selecting lines SL2 and SL4 are enabled and the word line WL0 corresponding to the memory cell B is enabled in order to turn on the memory cell B. Therefore, the current output from the sense amplifier SA flows through the main bit line BL(n), the selecting switch M24(n), the memory cell B, the selecting switch M42(n+1), and the main bit line GL(n+1), and then reaches the ground end GND, as the current path P shows. The content value of the memory cell B can be read by the sense amplifier SA sensing the value of the output current. If memory cell B has low threshold voltage, which represents the data of logic 1, the sense amplifier SA will sense a large current.

When reading the memory cell B, the current only flows along the current path P. And the equivalent resistance value of the current path P is the sum of the equivalent resistance values of the selecting switches M24(n) and M42(n+1), and the equivalent resistance value of the partial sub-bit lines SB4(n) and SB1(n+1). As the layout technology progresses, the width of bit lines decreases. Due to the inversely proportional relationship between the value of a resistance and the width of a bit line, the bit line resistance value increases. When inputting the same voltage, the output current decreases as the resistance becomes larger. Therefore, the decreased current of the current path P lowers the sensing accuracy of the sense amplifier. Thus, it is necessary to find a solution to reduce the loading value and then increase the current, in order to avoid errors by the sense amplifier SA.

SUMMARY OF THE INVENTION

It is therefore an object of this invention to provide a read-only memory with a lower loading value. By adding multiple rows of auxiliary switches, multiple current paths can be formed to reduce the loading value when reading a specific memory cell. Therefore, the current can be amplified, and the error by the sense amplifier can be decreased.

It is another object of this invention to provide a read-only memory, which includes multiple word lines parallel to each other. The read-only memory includes K memory banks. One of the K memory banks is an $n^{th}$ memory bank. The $n^{th}$ memory bank includes s a first main bit line BL(n), multiple first selecting switches, multiple second selecting switches, a first sub-bit line SB1(n), a second sub-bit line SB2(n), a third sub-bit line SB3(n), a fourth sub-bit line SB4(n), multiple first auxiliary switches, multiple second auxiliary switches, and multiple memory cells. Multiple first and second select switches are controlled by the first and the second select lines respectively. When these first selecting switches are turned on, the first bit line BL(n) is electrically connected to the second sub-bit line SB2(n) and the third sub-bit line SB3(n). When the second selecting switches are turned on, the first main bit line BL(n) is electrically connected to the third sub-bit line SB3(n) and the fourth sub-bit line SB4(n). A first auxiliary line SL1 controls the first auxiliary switches, and a second auxiliary line SL2 controls the second auxiliary switches. Some of the first and the second auxiliary switches have low threshold voltage, and word lines control multiple memory cells. Each memory cell is connected between two sub-bit lines. When a current flows through one of the memory cells, the current at least flow through one of the first or second auxiliary switches that are turned on.

Other objects, features, and advantages of the invention will become apparent from the following detailed description of the preferred but non-limiting embodiments. The following description is made with reference to the accompanying drawings.

DETAILED DESCRIPTION OF THE INVENTION

The spirit of this invention is that by adding multiple rows of auxiliary switches, multiple current paths can be formed to reduce loading values when reading a specific memory cell. Therefore, the current is increased, and the rate of errors by the sense amplifier can be decreased when reading a specific memory cell.

Figure 2:
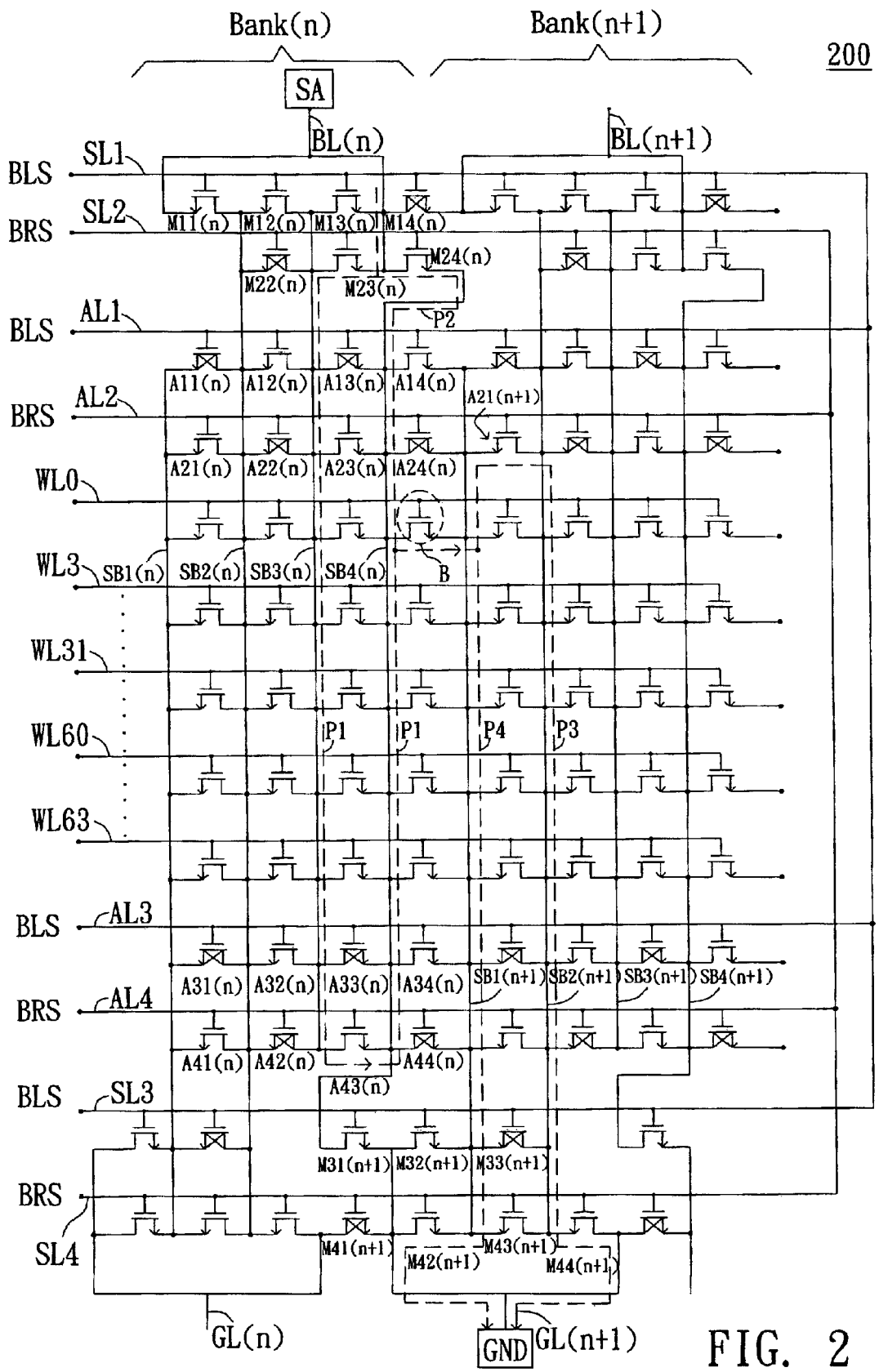
FIG. 2 illustrates a circuit diagram of a read-only memory according to an embodiment of the invention.

FIG. 2 illustrates a circuit diagram of a read-only memory according to an embodiment of the invention. A read-only memory 200 includes multiple word lines WL, such as word line WL0~WL63, which are parallel to each other. The read-only memory 200 can be divided into multiple memory banks. In FIG. 2, the $n^{th}$ memory bank, Bank (n) and the $(n+1)^{th}$ memory bank, Bank (n+1) have been selected to serve as an example illustrating the circuit structure of the read-only memory 200.

The $n^{th}$ memory bank, Bank(n) includes a first main bit line BL(n), a second main bit line GL(n), a first selecting line SL1, a second selecting line SL2, a first sub-bit line SB1(n), a second sub-bit line SB2(n), a third sub-bit line SB3(n), a fourth sub-bit line SB4(n), multiple first selecting switched, second selecting switched, third selecting switched, and fourth selecting switches, multiple first, second, third, and fourth auxiliary switches, and multiple memory cells.

Reading a memory cell can be achieved by connecting the first main bit line BL(n) with a sense amplifier SA and connecting the second main bit line GL(n) to the ground end GND. A selecting switch is used for optionally connecting a main bit line with a sub-bit line. In addition, by switching the auxiliary switch on or off, the number of current paths can be increased when reading a memory cell.

The first selecting line SL1 and the second selecting line SL2 are perpendicular to the first main bit line BL(n). First selecting switches M11(n), M12(n), M13(n), and M14(n) are controlled by the first selecting line SL1. The first main bit line BL(n) is electrically connected to one end of the first s M11(n) and M13(n). And both ends of the first M12(n) are electrically connected with the other end of the first selecting switches M11(n) and M13(n) respectively. In addition, both ends of the first selecting switch M14(n) are electrically connected with first main bit lines BL(n) and BL(n+1) respectively.

Second selecting switches M22(n), M23(n), and M24(n) are controlled by the second selecting line SL2. Each end of the second selecting switch M22(n) are electrically connected with the second sub-bit line SB2(n) and the third sub-bit line SB3(n) respectively. One end of the second selecting switch M23(n) also is electrically connected with the third sub-bit line SB3(n). One end of the second selecting switch M24(n) is electrically connected with the other end of the second selecting switch M23(n), and the other end of the second selecting switch M24(n) is electrically connected with the fourth sub-bit line SB4. The second selecting switch M22(n) is connected in parallel with the first selecting switch M12(n), and the second selecting switch M23(n) is connected in parallel with the first selecting switch M13(n).

When the first selecting line SL1 is enabled, the first selecting switches M11(n)~M14(n) will be turned on; then the first main bit line BL(n) will be electrically connected with the second sub-bit line SB2(n) and the third sub-bit line SB3(n). When the second selecting line SL2 is enabled, the second selecting switches M22(n)~M 24(n) will be turned on, and the first main bit line BL(n) will be electrically connect with the third sub-bit line SB3(n) and the fourth sub-bit line SB4(n).

The read-only memory is a symmetrical structure, so the way by which the second main bit line GL(n) is connected to a number of third and fourth selecting switches is similar to that by which the first main bit line BL(n) is connected to a number of first and second selecting switches. Using the second main bit line GL(n+1) as an example, the second main bit line GL(n+1) is located between the first main bit lines BL(n) and BL(n+1), so when the third selecting switches M31(n+1)~M33(n+1) are turned on, the second main bit line GL(n+1) will be electrically connected to the fourth sub-bit line SB4(n) and first sub-bit line SB1(n+1) of a $n^{th}$ memory bank. When the fourth selecting switches M41(n+1)~M44(n+1) are turned on, the second main bit line GL (n+1) is electrically connected to the first sub-bit line SB1(n+1) and the second sub-bit line SB2(n+1).

Multiple memory cells of the read-only memory are controlled by word lines, and each memory cell is connected between two adjacent sub-bit lines. For example, a memory cell B is controlled by a word line WL0, and two ends of memory cell B are electrically connected with the fourth sub-bit line SB4(n) and the first sub-bit line SB1(n+1) respectively.

The main characteristic of the read-only memory 200 in this invention is to use multiple auxiliary switches, such as the first auxiliary switches A11(n)~A14(n), the second auxiliary switches A21(n)~A24(n), the third auxiliary switches A31(n)~A34(n), and the fourth auxiliary switches A41(n)~A44(n), which are controlled by the first auxiliary line AL1, the second auxiliary line AL2, the third auxiliary line AL3, and the fourth auxiliary line AL4 respectively. In addition, two ends of the auxiliary switches A11(n)~A41(n) are electrically connected to the first sub-bit line SB1(n) and the second sub-bit line SB2(n), and each end of the auxiliary switches A12(n)~A42(n) is electrically connected to the second sub-bit line SB2(n) and the third sub-bit line SB3(n), and so on. At least part of the first, second, third, and fourth auxiliary switches have low threshold voltage. The auxiliary switches with low threshold voltage are represented by a transistor marked without the symbol X, and the auxiliary switches with high threshold voltage are represented by a transistor marked with the symbol X.

The main function of an auxiliary switch with low threshold voltage is each time it reads a memory cell, each main bit line is electrically connected to two sub-bit lines at the same time, so via an auxiliary switch that is turned on, and the two foregoing electrically connected sub-bit lines can form a current path. More parallel-connected current paths can effectively lower the loading value, thus achieving the object of this invention.

Furthermore, in order to simplify the circuit, it is designed to place a first auxiliary switch with low threshold voltage next to a first auxiliary switch with high threshold voltage. For example, the first auxiliary switch A11(n) has high threshold voltage, and the first auxiliary switch A12(n) has low threshold voltage. The same method can be applied to all the second, third, and fourth auxiliary switches. The first and second auxiliary switches can also be interlaced. That is, the first auxiliary switches with low threshold voltage are connected in parallel with the second auxiliary switches with high threshold voltage, and the first auxiliary switches with high threshold voltage are connected in parallel with the second auxiliary switches with low threshold voltage. For example, the first auxiliary switch A11(n) has high threshold voltage and the second auxiliary switch A21(n) has low threshold voltage. Additionally, the third auxiliary switches can interlace with the fourth auxiliary switches.

The operation of the read-only memory 200 in FIG. 2 is illustrated as follows.

For simplifying circuit operation, the first selecting line SL1, the third selecting line SL3, the first auxiliary line AL1, and the third auxiliary line AL3 are controlled by the control signal BLS, and the second selecting line SL2, the fourth selecting line SL4, the second auxiliary line AL2, and the fourth auxiliary line AL4 are controlled by the control signal BRS.

Reading memory cell B is used here as an example. When reading memory cell B, first, the first main bit line BL(n) has to be connected to a sense amplifier SA and driven by the sense amplifier, and the second main bit line GL(n+1) has to connect to a ground end GND. Then, the word line WL0 corresponding to memory cell B is enabled; the second selecting line SL2 and the fourth selecting line SL4 corresponding to the memory cell B are enabled, and the second auxiliary line AL2 and the fourth auxiliary line AL4 corresponding to the memory cell B are enabled.

Then, multiple current paths are created; for example, at the minimum, current paths P1, P2, P3, and P4 are formed. The current output from a sense amplifier SA flows through the first main bit line BL(n), the third sub-bit line SB3($n$), the fourth auxiliary switch A43($n$), and the fourth sub-bit line SB4($n$) to form the current path P1. The current output from a sense amplifier SA flows through the first main bit line BL(n) and the fourth sub-bit line SB4($n$), and then reaches memory cell B to form the current path P2. The current from memory cell B flows through the second auxiliary switch A21(n+1) and the second sub-bit line SB2(n+1), and then reaches the ground end GND to form the current path P3. The current from memory cell B flows through the first sub-bit line SB1(n+1) and then reaches the ground end GND to form the current path P4.

Figure 3A:
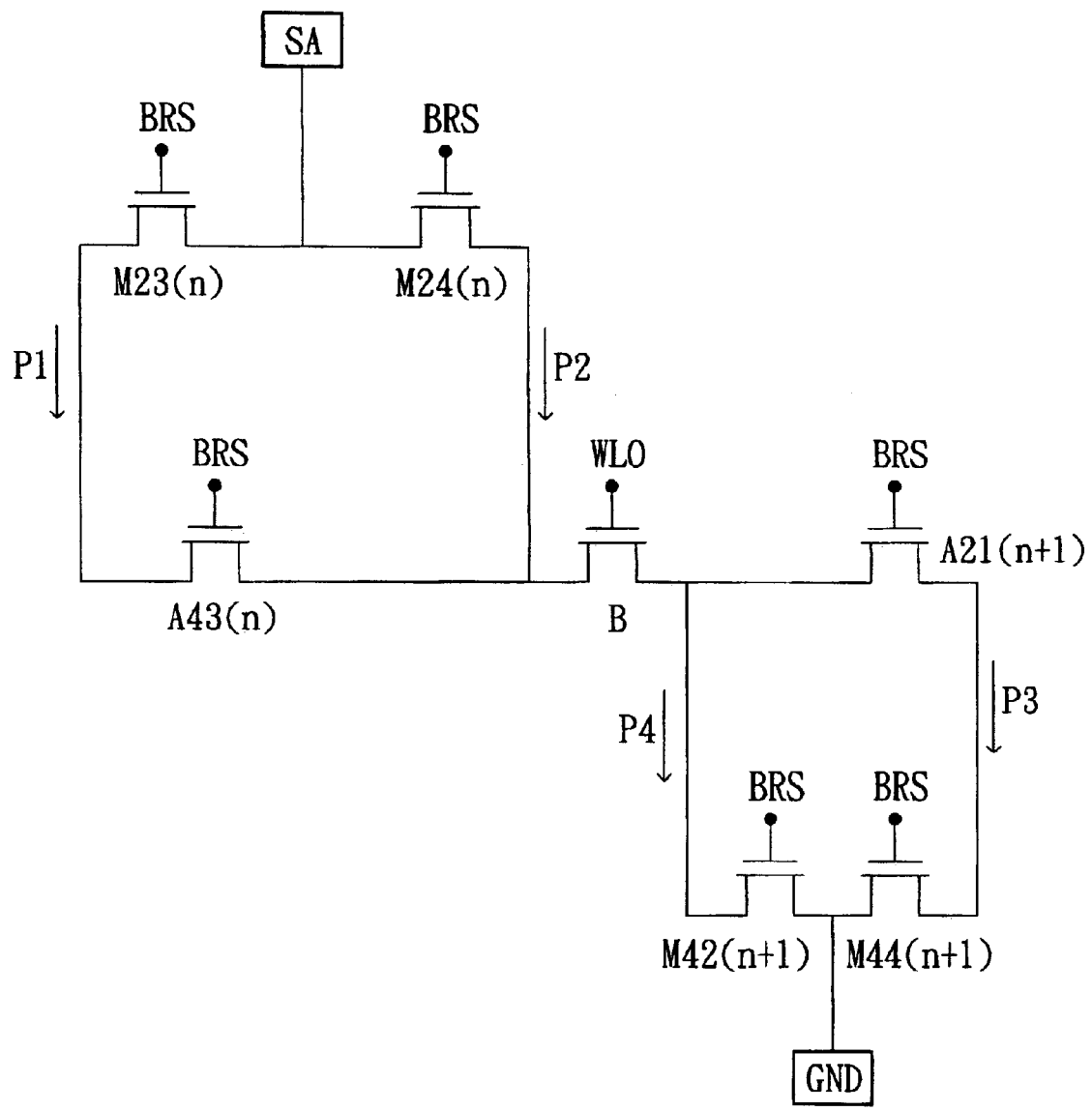
FIG. 3A illustrates a simplified circuit diagram of FIG. 2 when reading a memory cell B.
Figure 3B:
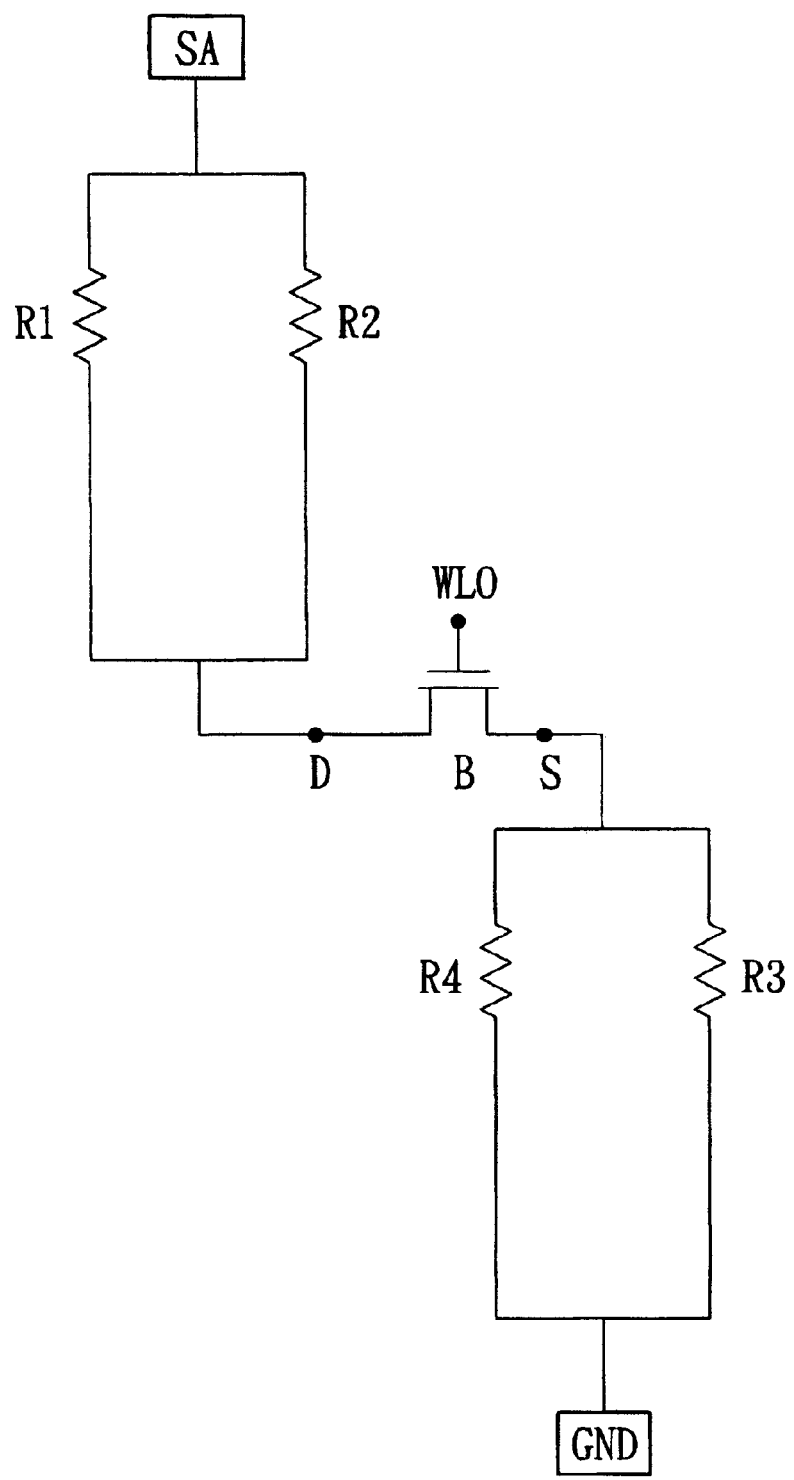
FIG. 3B illustrates an equivalent circuit diagram of FIG. 3A.

Please refer to FIG. 3 to see the effect of reducing the loading values by creating multiple current paths. FIG. 3 illustrates the simplified circuit diagram of FIG. 2 when reading memory cell B. If the equivalent resistance value of the current path P1 is R1, the equivalent resistance value of the current path P2 is R2, the equivalent resistance value of the current path P3 is R3, and the equivalent resistance value of the current path P4 is R4, then FIG. 3B is the equivalent circuit diagram of FIG. 3A.

Figure 1:
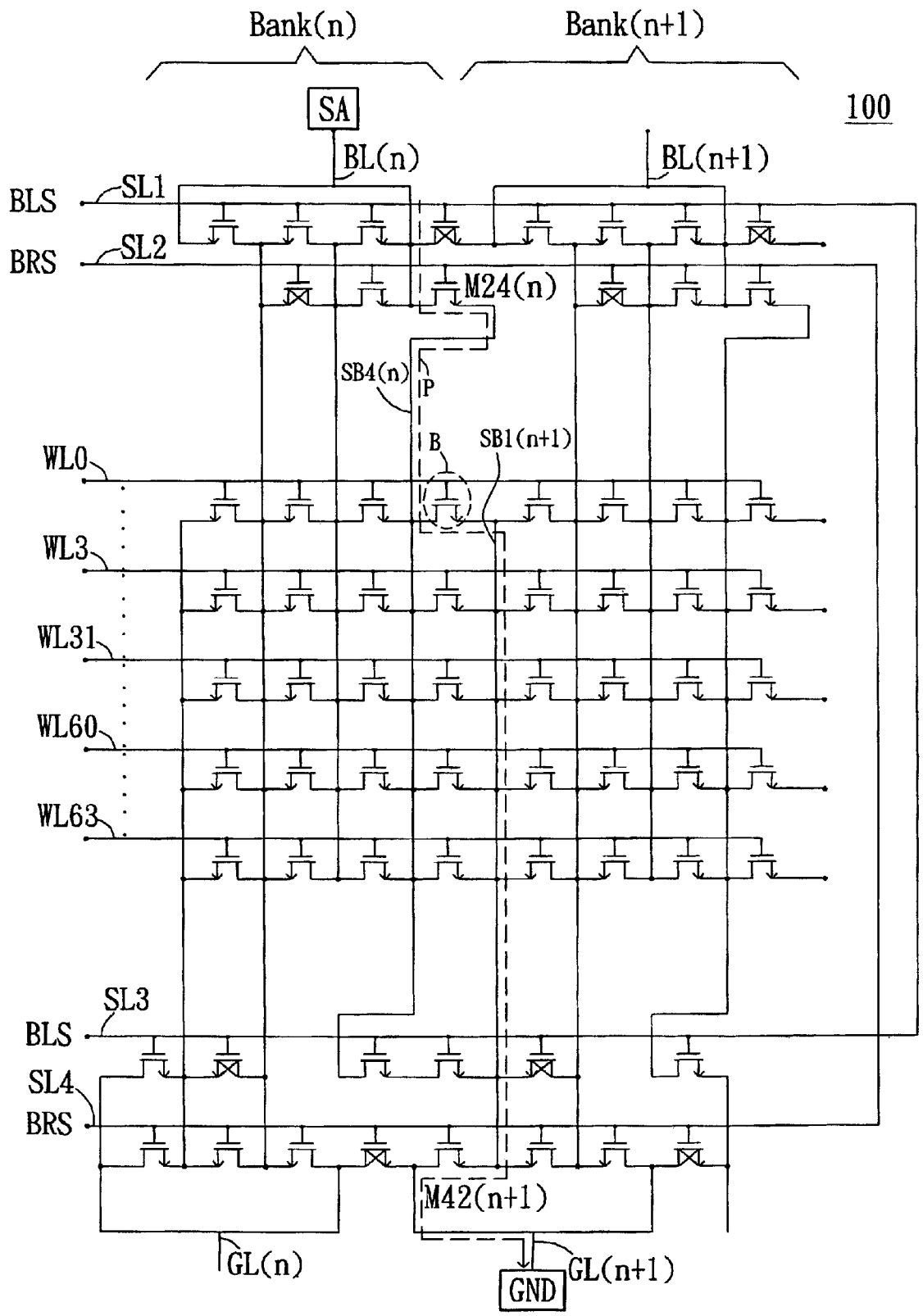
FIG. 1 illustrates an equivalent circuit diagram of a traditional read-only memory.

As FIG. 3B shows, for the memory cell B, the equivalent resistance in its drain D is the equivalent resistance of parallel resistors R1 and R2. The equivalent resistance of parallel resistors R1 and R2 must be smaller than the value of either R1 or R2. The equivalent resistance in the source S of memory cell B is the equivalent resistance of parallel resistors R3 and R4. The equivalent resistance of parallel resistors R3 and R4 must be smaller than the value of either R3 or R4. Comparing the invention as shown in FIG. 3B with a traditional operation shown in FIG. 1, both the equivalent resistances in the drain D and the source S of memory cell B become smaller; when each circuit sense amplifier SA supplies signal of the same voltage, the sense amplifier SA in FIG. 3B will sense larger current than in the traditional circuit. The increased current will improve the accuracy of the sense amplifier SA in sensing current signals.

Smaller resistances can be achieved by changing the width of the selecting and auxiliary switch transistors, such as changing the width of the selecting lines and auxiliary lines.

Although the auxiliary switches in FIG. 2 are located between selecting switches and memory cells, this invention is not limited to this configuration. Auxiliary switches can also be located in other parts of a read-only memory circuit, such as be inserted in a memory array, which is formed by memory cells. This invention includes the option to place auxiliary switches at other locations in a read-only memory circuit, as long as the object of creating multiple current paths is achieved. The numbers of rows of auxiliary switches are not limited to four rows, including the first to fourth row auxiliary switches as shown in FIG. 2. According to the spirit of this invention, increasing the number of rows of auxiliary switches can be applied to reduce loading values. In general, the circuit structure of a read-only memory is a symmetrical structure, while in the spirit of this invention, the circuit structure can be arranged to be asymmetrical.

The above-mentioned preferred embodiment of this invention reveals that the object of reducing loading values of a read-only memory can be achieved by creating multiple current paths. Then, the sense amplifier accuracy rate can be improved.

While the invention has been described by way of example and in terms of a preferred embodiment, it is to be understood that the invention is not limited thereto. On the contrary it is intended to cover various modifications and similar arrangements and procedures, and the scope of the appended claims therefore should be accorded the broadest interpretation so as to encompass all such modifications and similar arrangements and procedures.

What is claimed is:

1. A read-only memory including a plurality of word lines and K memory banks, each word line being parallel to each other and one of the K memory banks being an $n_{th}$ memory bank, the $n^{th}$ memory bank comprising:

a first main bit line BL(n);

a first selecting line and a second selecting line, which are perpendicular to the first main bit line BL(n);

a plurality of first selecting switches and a plurality of second selecting switches that are controlled by the first selecting line and second selecting line respectively;

a first sub-bit line SB1($n$), a second sub-bit line SB2($n$), a third sub-bit line SB3($n$), and a fourth sub-bit line SB4($n$), wherein when the first selecting switches are turned on, the first main bit line BL(n) is electrically connected to the second sub-bit line SB2($n$) and the third sub-bit line SB3($n$); when the second selecting switches are turned on, the first main bit line BL(n) is electrically connected to the third and fourth sub-bit lines SB3($n$) and SB4($n$) respectively;

a plurality of first auxiliary switches and a plurality of second auxiliary switches, wherein the first auxiliary switches are controlled by a first auxiliary line SL1 and the second auxiliary switches are controlled by the second auxiliary line SL2, and wherein at least some of the first and the second auxiliary switches have low threshold voltage; and a plurality of memory cells, which are controlled by a plurality of word lines, and each memory cell is connected between two adjacent sub-bit lines;

wherein when a current flows through one of the memory cells, the current at least flow through one of the first or the second auxiliary switches that are turned on.

2. The read-only memory according to claim 1, wherein the first auxiliary switches with low threshold voltage are arranged next to the first auxiliary switches with high threshold voltage respectively.

3. The read-only memory according to claim 2, wherein the second auxiliary switches with low threshold voltage are arranged next to the second auxiliary switches with high voltage respectively.

4. The read-only memory according to claim 3, wherein the first and second auxiliary switches are interlaced.

5. The read-only memory according to claim 1, wherein the read-only memory further comprises:

a second main bit line GL(n);

a plurality of third selecting switches and a plurality of fourth selecting switches, which are respectively controlled by a third selecting line and a fourth selecting line respectively, wherein when the third selecting switches are turned on, the second main bit line GL(n) is electrically connected to a fourth sub-bit line SB4(n−1) of the (n−1)$^{th}$ memory bank and the first sub-bit line SB1($n$), and when the fourth selecting switches are turned on, the second main bit line GL(n) is electrically connected to the first sub-bit line SB1($n$) and the second sub-bit line SB2($n$); and a plurality of third and a plurality of fourth auxiliary switches, wherein the third auxiliary switches are controlled by a third auxiliary line AL3, and the fourth auxiliary switches are controlled by a fourth auxiliary line AL4, at least some of the third and fourth auxiliary switches have low threshold voltage;

wherein when the current flows through one of the memory cells, the current at least flow through one of the third or fourth auxiliary switches that are turned on.

6. The read-only memory according to claim 5, wherein the third auxiliary switches with low threshold voltage are arranged next to the third auxiliary switches with high voltage respectively.

7. The read-only memory according to claim 6, wherein the fourth auxiliary switches with low threshold voltage are arranged next to the fourth auxiliary switches with high voltage respectively.

8. The read-only memory according to claim 7, wherein the third auxiliary switches and the fourth auxiliary switches are interlaced.

9. A method of reading a read-only memory, wherein the read-only memory includes a plurality of word lines which are parallel to each other, and the read-only memory includes K memory banks, one of the K memory banks is an n$^{th}$ memory bank, and the n$^{th}$ memory bank includes:

a first main bit line BL(n), a second main bit line GL(n), and a first, second, third, and fourth sub-bit lines SB1($n$)~SB4($n$);

a first and a second selecting lines, which are perpendicular to the first main bit line BL(n);

a plurality of first and second selecting switches, which are respectively controlled by the first and the second selecting lines;

a plurality of first and second auxiliary switches, which are respectively controlled by a first auxiliary line AL1 and a second auxiliary line AL2, and at least some of the first and the second auxiliary switches have low threshold voltage; and a plurality of memory cells, which are controlled by the word lines with each memory cell connected between two adjacent sub-bit lines;

the method of reading one of the memory cells chosen from the n$^{th}$ memory bank of the read-only memory comprises:

driving the first main bit line BL(n) by a sense amplifier, and connecting a second main bit line GL(n+1) of a (n+1)$^{th}$ memory bank to a ground end;

enabling the word line corresponding to the chosen memory cell;

enabling the first selecting line or the second selecting line corresponding to the chosen memory cell in order to turn on the first selecting switch or second selecting switches, wherein when the first selecting switches are turned on, the first main bit line BL(n) is electrically connected to the second sub-bit line SB2($n$) and the third sub-bit line SB3($n$), and when the second selecting switches are turned on, the first main bit line is electrically connected to the third sub-bit line SB3($n$) and the fourth sub-bit line SB4($n$);

enabling the third selecting line or fourth selecting line corresponding to the chosen memory cell in order to turn on the third selecting switches or fourth selecting switches, wherein when the third selecting switches are turned on, the second main bit line GL(n+1) is electrically connected to the fourth sub-bit line SB4($n$) and a first sub-bit line SB1(n+1) of a (n+1)$^{th}$ memory bank, and when the fourth selecting switches are turned on, the second main bit line GL(n+1) is electrically connected to the first sub-bit line SB(n+1) and the second sub-bit line SB2(n+1); and enabling the first auxiliary line AL1 or the second auxiliary line AL2 corresponding to the chosen memory cell in order to turn on the first or second auxiliary switches;

wherein when a current flows through the chosen memory cell, the current should at least flow through one of the first or second auxiliary switches that are turned on.

10. The method according to claim 9, wherein the read-only memory further includes a plurality of third and fourth auxiliary switches, which are respectively controlled by a third auxiliary line AL3 and a fourth auxiliary line AL4, and at least some of the third and fourth auxiliary switches have low threshold voltage;

the method of reading one of the chosen memory cells in the n$^{th}$ memory banks of the read-only memory further comprises:

enabling the third auxiliary line AL3 and the fourth auxiliary line AL4 corresponding to the chosen memory cell in order to turn on the third or fourth auxiliary switches, wherein at least some of the third and fourth auxiliary switches have low threshold voltage;

wherein when the current flows through the chosen memory cell, the current should at least flow through one of the third or fourth auxiliary switches that are turned on.

* * * * *